United States Patent
Erickson et al.

(10) Patent No.: US 7,071,811 B2
(45) Date of Patent: Jul. 4, 2006

(54) HIGH PERFORMANCE VOLTAGE CONTROL DIFFUSION RESISTOR

(75) Inventors: Sean Christopher Erickson, Fort Collins, CO (US); Jonathan Alan Shaw, Fort Collins, CO (US); Jay Tatsuo Fukumoto, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/668,875

(22) Filed: Sep. 23, 2003

(65) Prior Publication Data

US 2005/0062586 A1   Mar. 24, 2005

(51) Int. Cl.
*H01C 1/012* (2006.01)

(52) U.S. Cl. .................................... 338/309; 338/325
(58) Field of Classification Search ............... 338/309, 338/12, 9, 308, 322, 325, 326, 330; 257/379; 333/81 R
See application file for complete search history.

(56) References Cited

U.S. PATENT DOCUMENTS

| | | | | |
|---|---|---|---|---|
| 3,195,071 A | * | 7/1965 | Steinhoff | 331/107 T |
| 3,254,309 A | * | 5/1966 | Miller | 330/287 |
| 3,320,550 A | * | 5/1967 | Gerlach | 331/96 |
| 3,566,219 A | * | 2/1971 | Nelson et al. | 257/271 |
| 4,219,829 A | * | 8/1980 | Dorda et al. | 331/115 |
| 4,321,616 A | * | 3/1982 | Bise | 257/536 |
| 4,426,655 A | * | 1/1984 | Bhatia et al. | 257/212 |
| 4,893,158 A | | 1/1990 | Mihara et al. | |
| 5,220,194 A | * | 6/1993 | Golio et al. | 257/601 |
| 5,260,595 A | * | 11/1993 | Hayama | 257/379 |
| 5,359,256 A | * | 10/1994 | Gray | 313/169 |
| 5,430,323 A | * | 7/1995 | Yamazaki et al. | 257/471 |
| 5,532,175 A | * | 7/1996 | Racanelli et al. | 438/163 |
| 6,087,193 A | * | 7/2000 | Gray | 438/20 |
| 6,455,919 B1 | | 9/2002 | Brennan et al. | |
| 6,521,515 B1 | * | 2/2003 | Kluth | 438/486 |
| 2004/0075146 A1 | * | 4/2004 | Yu | 257/362 |
| 2004/0110324 A1 | * | 6/2004 | King | 438/142 |
| 2004/0164359 A1 | * | 8/2004 | Iwata et al. | 257/379 |
| 2005/0062586 A1 | | 3/2005 | Erickson et al. | |

* cited by examiner

*Primary Examiner*—Tu Hoang
*Assistant Examiner*—Karl D. Easthom
(74) *Attorney, Agent, or Firm*—Yee & Associates

(57) ABSTRACT

The present invention provides a diffusion resistor that is formed in the substrate. A diffusion region is formed within the substrate that contains a first and second contact region. These contact regions extend downward from the surface of the substrate. A third contact is located within the diffusion region between the first and second contacts. This contact also extends downward from the surface of the substrate. These contacts are connected to metal layers. The first and second contacts form the two ends of the diffusion resistor. The third contact forms a Schottky diode such that application of a voltage to this contact forms a depletion region within the diffusion region. The depletion region changes in size depending on the voltage applied to the third contact to change the resistance of the depletion resistor.

11 Claims, 4 Drawing Sheets

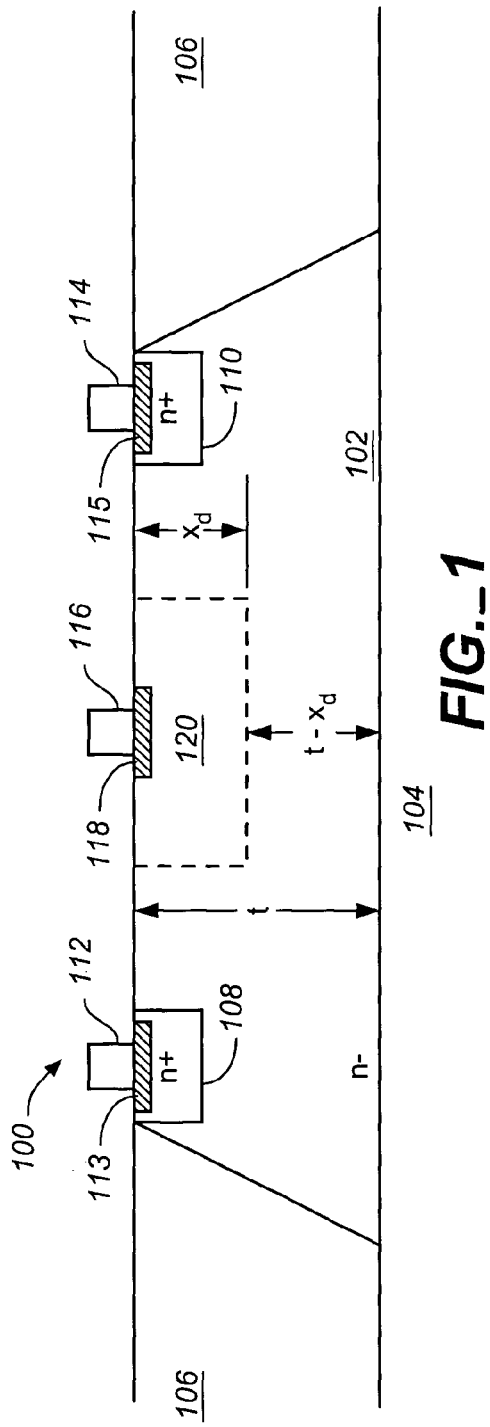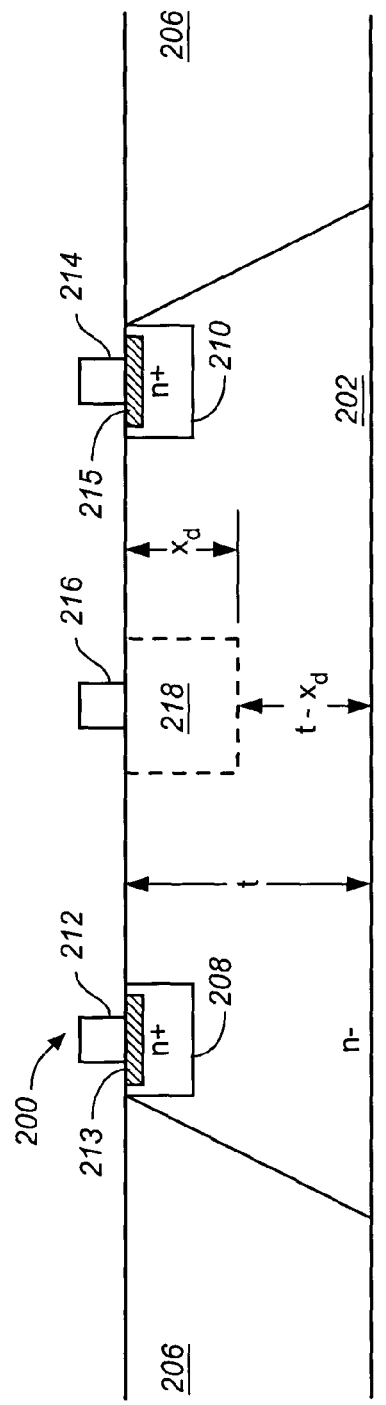

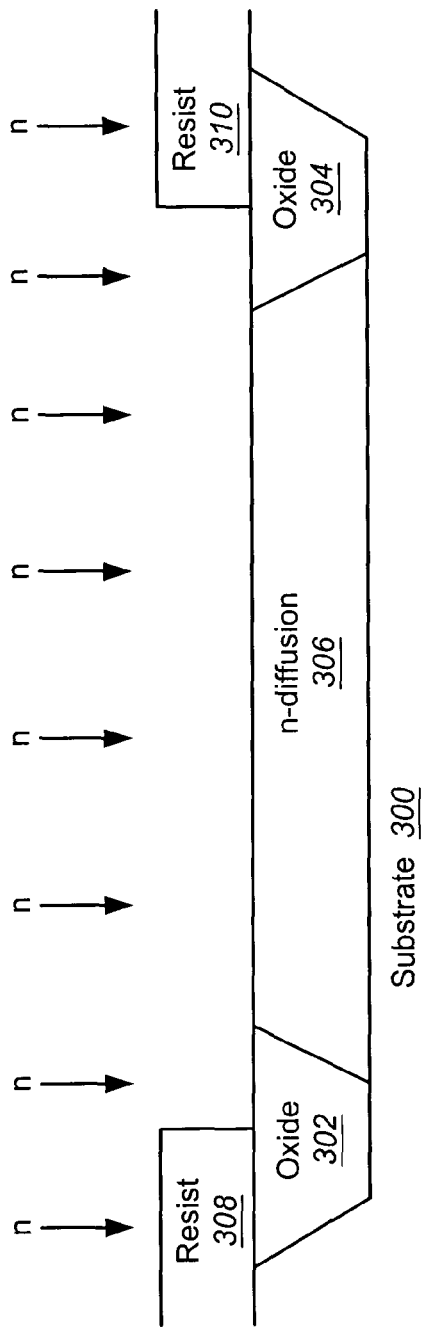
FIG._3A
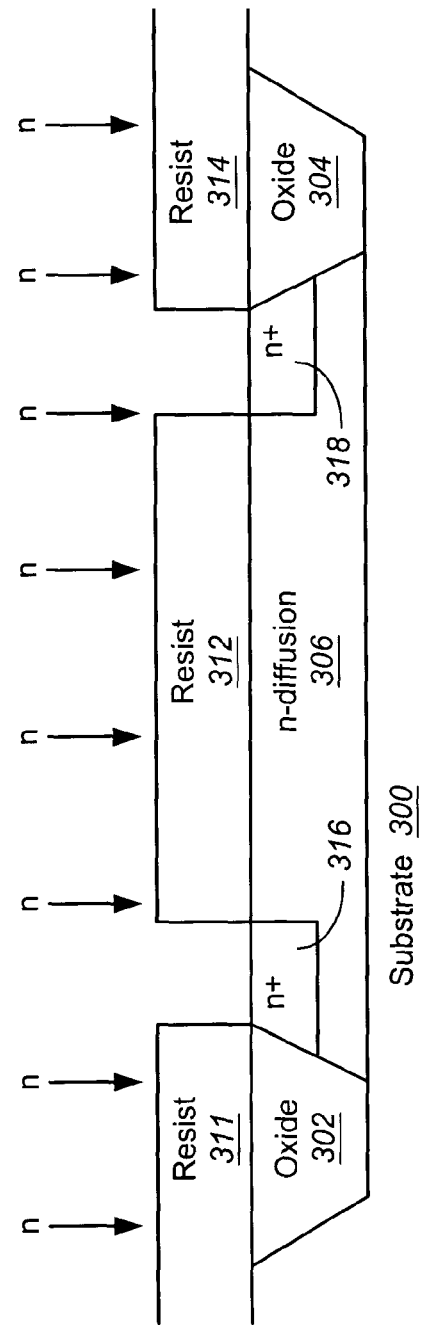
FIG._3B

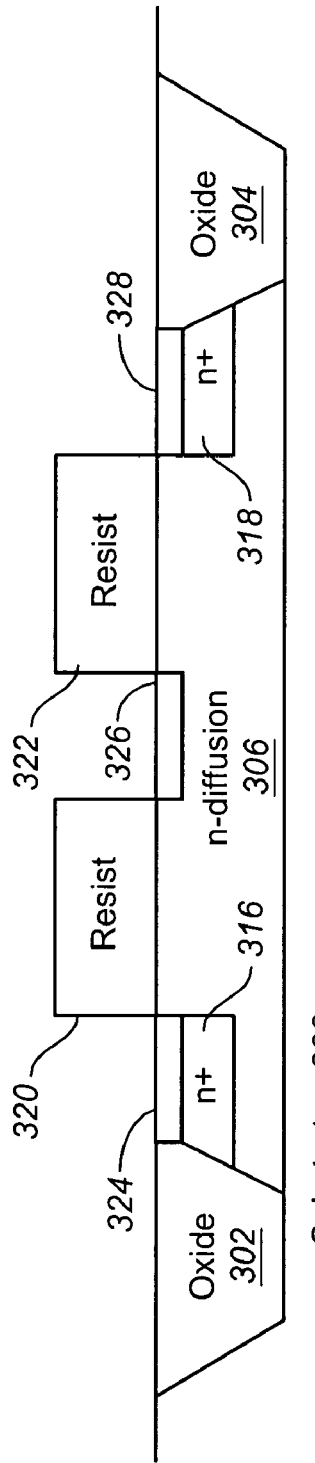
FIG._3C
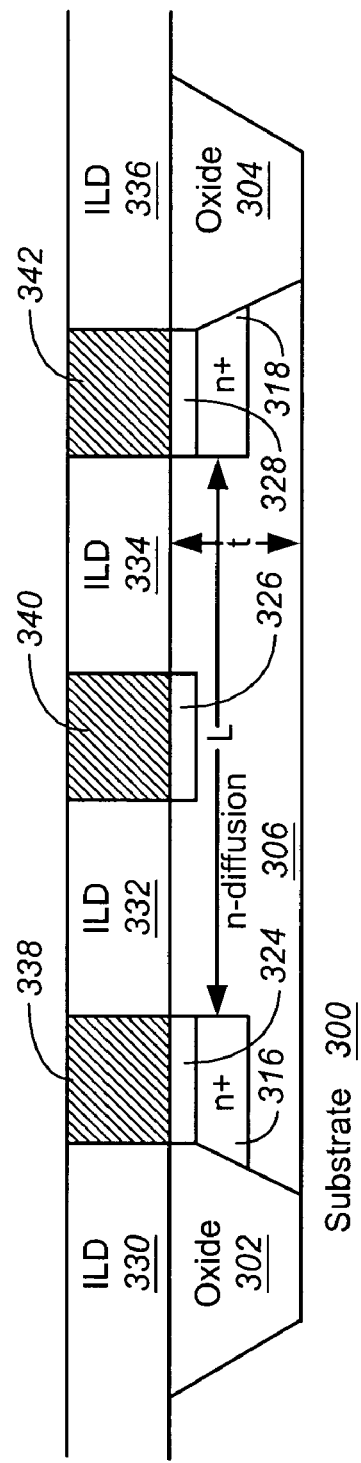
FIG._3D

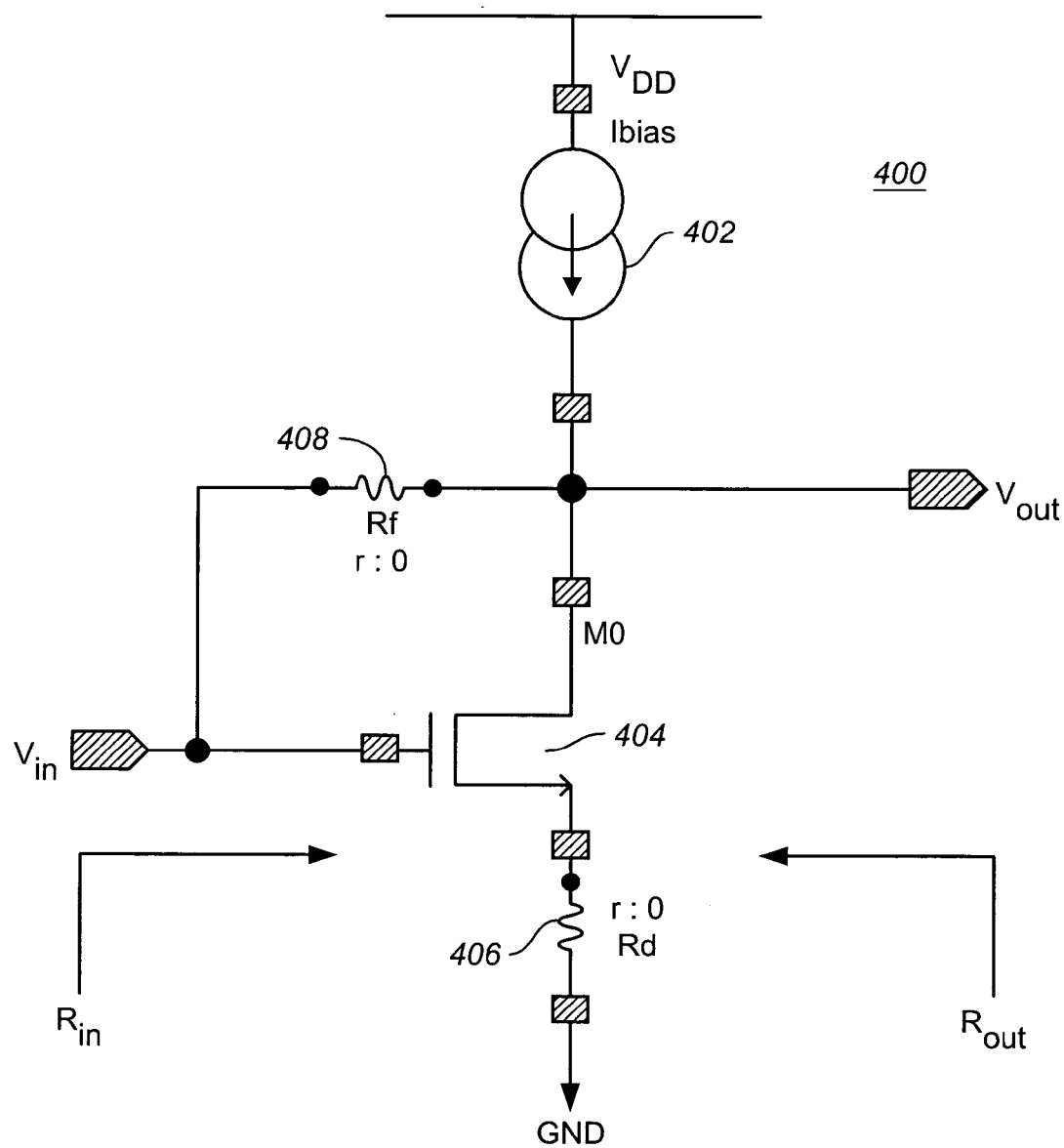
FIG._4

HIGH PERFORMANCE VOLTAGE CONTROL DIFFUSION RESISTOR

BACKGROUND OF THE INVENTION

1. Technical Field

The present invention relates generally to an improved circuit system and in particular to a resistor. Still more particularly, the present invention relates to a high-precision voltage controlled diffusion resistor.

2. Description of the Related Art

A resistor is an electrical device that may convert energy into heat. The letter R is used to denote the resistance value of a resistor. With this device, two possible reference choices are present for the current and voltage at the terminals of the resistor. One is current in the direction of the voltage drop across the resistor and another is the current in the direction of voltage rise across the resistor.

Some existing problems with respect to resistors include transmission line impedance mismatching, the physical size required for diffusion resistors, and process variation in diffusion resistors. Currently, existing solutions for these problems include special Microwave Integrated Circuit (MIC) processes to make trimmed resistors. Further, high-precision discrete components are attached by soldering or bonding components to an integrated circuit (IC) or package. These currently used solutions are expensive with respect to the manufacturing of semiconductors. This type of process involves using a laser to trim the resistors. The resistance is measured and a laser is used to reduce the size of the resistor. This type of process requires much time and is expensive to perform on a per circuit basis. Further, these existing solutions are difficult to integrate into a silicon IC process because of the size of components and/or specialized manufacturing requirements needed to trim the devices. Further, discrete or trimmed components are not adjustable after the manufacture of a product.

Therefore, it would be advantageous to have an improved diffusion resistor that overcomes the problems of the existing solutions.

SUMMARY OF THE INVENTION

The present invention provides a diffusion resistor that is formed in the substrate. A diffusion region is formed within the substrate that contains a first and second contact region. These contact regions extend downward from the surface of the substrate. A third contact is located within the diffusion region between the first and second contacts. This contact also extends downward from the surface of the substrate. These contacts are connected to metal layers. The first and second contacts form the two ends of the diffusion resistor. The third contact forms a Schottky diode such that application of a voltage to this contact forms a depletion region within the diffusion region. The depletion region changes in size depending on the voltage applied to the third contact to change the resistance of the depletion resistor.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a cross-section of a voltage controlled diffusion resistor in accordance with a preferred embodiment of the present invention;

FIG. 2 is a cross-section of a non-salicided version of a diffusion resistor in accordance with a preferred embodiment of the present invention;

FIGS. 3A–3D are diagrams illustrating cross-sections in processing steps for creating a voltage controlled diffusion resistor in accordance with the preferred embodiments of the present invention; and FIG. 4 is a schematic diagram of a radio frequency (RF) driver or receiver circuit with RF feedback in accordance with a preferred embodiment of the present invention.

DETAILED DESCRIPTION

The present invention provides for an improved diffusion resistor that is voltage controlled. The illustrative embodiments of the present invention take advantage of the fact that a Schottky diode is created when a metal comes into contact with a lightly doped semiconductor. The depletion layer that results in the metal to semiconductor contact may be used in conjunction with a voltage bias on a Schottky diode to reduce or increase the effective resistance of a diffusion resistor.

The structure of a high-precision voltage controlled diffusion resistor in the illustrative embodiments of the present invention includes a low mobility diffusion region with a positive contact at one end and a negative contact at the opposite end. A center tap is present consisting of the Schottky diode, formed by a metal to low mobility diffusion contact. The negative and positive contact regions are typical ohmic contacts.

Depending on the particular embodiment, a salicided region may be used at the contact interface while in another illustrative embodiment, only a metal contact is present. The resistance is made variable in these depicted examples through providing an ability to tune the resistor through a voltage controlled contact (VCC). This contact is located at about center of the resistor structure in these examples. Since the contact acts as a Schottky diode, a depletion layer is created at the VCC interface, which partially depletes the thickness of the diffusion resistor by a selected distance. The total conduction thickness may be changed by altering the depletion thickness through biasing the VCC contact. Through changing the depletion thickness, the total conduction thickness may be changed. As a result, an increase or decrease in effective resistance in the structure is created depending on the particular voltage applied to the VCC contact. In this manner, an ability to vary the resistance of the diffusion resistor through a voltage bias is accomplished.

The illustrative embodiments of the present invention provide for a reduction in physical resistor size. The reduction in the conduction thickness provides for creating a resistor of a higher value in the same space as a diffusion resistor without the use of a Schottky contact. This advantage is accomplished in the depicted examples because the effective conduction thickness is reduced by "Xd". A basic diffusion resistor has the same conduction thickness of "t". In contrast, the diffusion resistor of the present invention using a VCC has a conduction thickness of "t-Xd". In these examples, the VCC may be tied to ground and an increase in the effective resistance still exists.

The processes, steps, and structures described below do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures below represent cross sections of a portion of an integrated circuit during fabrication and are not drawn to scale, but are drawn so as to illustrate the important features of the invention.

With reference now to the figures and in particular with reference to FIG. 1, a cross-section of a voltage controlled diffusion resistor is depicted in accordance with a preferred embodiment of the present invention. In this example, diffusion resistor 100 is formed within region 102 in substrate 104. Substrate 104 is a p-substrate or an insulator in these examples. Typically, a p-substrate is used in a CMOS process and an insulator is used in a silicon on insulator process (SOI). Region 102 is an n− diffusion region in these examples. Further, diffusion resistor 100 is surrounded by shallow trench isolation (STI) region 106. As illustrated, n+ contact region 108 and n+ contact region 110 are formed within diffusion region 102. Contact 112 and contact 114 are formed on salicided regions 113 and 115. Salicided region 113 is formed on n+ contact region 108, and salicided region 115 is formed on n+ contact region 110. These contacts are standard ohmic contacts formed by metal layers. Contact 112 in this example is a positive terminal for diffusion resistor 100, while contact 114 forms a minus terminal for diffusion resistor 100. Contact 116 is a voltage control contact (VCC) for a Schottky diode. In this example, contact 116 is formed over salicided region 118. Depending on the voltage bias applied to contact 116, depletion region 120 is formed and may grow or shrink.

As voltage is applied to contact 116, depletion region 120 grows in size. In particular, $x_d$ represents the depth of depletion region 120. This value increases as voltage is applied to contact 116. In this example, t represents the thickness of region 102 and also represents the conductivity. The overall conductivity is $t-x_d$ in which the conductivity decreases as $x_d$ increases with the size of depletion region 120.

Turning next to FIG. 2, a non-salicided version of a diffusion resistor is depicted in accordance with a preferred embodiment of the present invention. Diffusion resistor 200 is essentially identical to diffusion resistor 100 in FIG. 1. As can be seen, diffusion region 202 is formed within substrate 204 and surrounded by STI region 206. Within depletion region 202 are n+ contact region 208 and n+ contact region 210. Contact 212 and contact 214 are formed over salicided regions 213 and 215, which are formed over n+ contact regions 208 and 210. Further, contact 216 is formed on region 202. In this example, however, a salicided region is absent. As with diffusion resistor 100 in FIG. 1, depletion region 218 is formed and may increase or decrease in size depending on the voltage bias applied to contact 216.

Turning now to FIGS. 3A–3D, diagrams illustrating cross-sections in processing steps for creating a voltage controlled diffusion resistor are depicted in accordance with the preferred embodiments of the present invention. In FIG. 3A, substrate 300 is a p-substrate or may be an insulator. Oxide regions 302 and 304 have been formed around n-diffusion region 306. Further, resist sections 308 and 310 have been placed on the surface of the device. In this example, the cross-section represents the manufacturing of the n-diffusion resistor at a point after shallow trench isolation formation has occurred. An n-type dopant is implanted into the device. In this example, the dopant may be, for example, phosphorous or arsenic. The implant is performed to result in a low concentration of n-type dopants. These dopants in these examples have a concentration of about $1\times10^{15}$ per $cm^3$. The doping profile of n-diffusion region 306 may be tuned in these examples to reduce parasitic capacitance.

In FIG. 3B, photo resist sections 311, 312, and 314 have been formed over the device. This formation of these sections is typically formed by laying a photo resist layer and removing sections through selected development of the resist layer. Next, an n-type dopant is implanted into the device to form n+ contact region 316 and n+ contact region 318. This implant step is performed to result in a high concentration of n-type dopants in the contact regions. Typically, the concentration may range from $1\times10^{18}$ per $cm^3$ to $1\times10^{20}$ per $cm^3$.

In FIG. 3C, resist regions 320 and 322 are formed on the device. Thereafter, salicided regions 324, 326, and 328 are formed. These regions are formed by deposition of a refractory metal followed by a rapid thermal anneal process. In the depicted examples, formation of these regions may be blocked depending on the particular implementation or processing used. By avoiding the creation of these salicided regions, the effect of the Schottky diode is enhanced. However, blocking formation of these regions complicates the typical processing of the device. Therefore, depending on the particular implementation, the salicided regions may remain. A salicided contact region is more common in CMOS devices. These regions are used to increase the effect of resistance of the device. The refractory metal used for salicided regions 324, 326, and 328 is typically titanium or cobalt.

In FIG. 3D, interlayer dielectric regions 330, 332, 334, and 336 are formed. These regions are formed by creating a single dielectric layer and then selectively etching the layer to form contact regions. The deposition of a refractory metal into the contact regions forms contacts 338, 340, and 342. In these examples, the length "l" and the thickness "t" are designed to be minimized to maximize the effect of the voltage effect on the resistor. These contacts are typically formed using tungsten.

Turning now to FIG. 4, a schematic diagram of a Rf driver or receiver circuit with RF feedback is depicted in accordance with a preferred embodiment of the present invention. In these examples, the RF feedback employs a variable resistor, such as the variable resistor in the illustrated examples. In this example, circuit 400 includes current source 402, transistor 404, resistor 406, and resistor 408. In these examples, resistor 406 is a Rd resistor connecting transistor 404 to ground. Current source 402 has one end connected to transistor 404 and another end connected to voltage source VDD. Further, transistor 404 and current source 402 are connected to Vout. Vin is connected to the gate of transistor 404 and resistor 408. In these examples, resistor 408 is a variable diffusion resistor as illustrated in the depicted examples.

Thus, the present invention in the illustrated examples provides for an adjustable or tunable resistance value in a diffusion resistor. The absolute value of the resistor in these examples may be modified with a voltage bias on the metal contact of the Schottky diode. By changing the voltage bias, the thickness of the resistor may be increased or decreased. With this feature, impedance matching adjustment for radio frequency (Rf) driver/receiver circuits may be made. The voltage controlled diffusion resistor in the illustrated examples allows for adjustment of the resistor value Rin for a receiver application or Rout for a driver application to match the transmission line impedance. In this manner, unwanted voltage reflections and signal loss are reduced or eliminated.

Further, adjustments to resistance allow for a bias current adjustment for mixed signal circuits. Also, the reduction in the size of the resistor is accomplished by reducing the resistor thickness. Additionally, resistance values may be self-adjusting through various circuit design techniques, such as implementing a feedback circuit with the resistor of the present invention. Further, the variable resistance value may be adjusted to compensate for process variations to provide for uniform resistance. Also, the variable resistance may be adjusted to a very high resistance to put an analog circuit in a low current or low power sleep mode.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A diffusion resistor comprising:
   a substrate;
   a diffusion region formed in the substrate;
   a first contact region extending down from a surface of the substrate;
   a second contact region extending down from the surface of the substrate;
   a first conductive contact electrically connected to the first contact region such that current can flow between the first contact and the first contact region;
   a second conductive contact electrically connected to the second contact region such that current can flow between the second contact and the second contact region; and
   a third contact connected to the surface of the substrate and electrically isolated from the first conductive contact and the second conductive contact, wherein the third contact is located between the first conductive contact and the second conductive contact, wherein the third contact forms a Schottky diode with a voltage being applied to the third contact to form a depletion region that changes in size depending on the voltage applied to the third contact to change a resistance in the diffusion resistor, wherein the first conductive contact and the second conductive contact form two ends of the diffusion resistor with no bias voltage on either of the first conductive contact and the second conductive contact.

2. The diffusion resistor of claim 1, wherein the third contact is connected to the surface by a salicided region.

3. The diffusion resistor of claim 1, wherein the substrate is a p-type substrate.

4. The diffusion resistor of claim 1, wherein the substrate is an insulator in a silicon-on-insulator substrate.

5. The diffusion resistor of claim 3, wherein the first contact region and the second contact region are n+ contact regions.

6. The diffusion resistor of claim 5, wherein the first conductive contact, the second conductive contact, and the third contact are formed using metal layers.

7. The diffusion resistor of claim 6, wherein the metals layers are tungsten metal layers.

8. The diffusion resistor of claim 1, wherein the diffusion region contains n-type dopants having a concentration of about $1 \times 10^{15}/cm^3$.

9. The diffusion resistor of claim 1, wherein the first contact region and the second contact region contain n-type dopants having a concentration of about $1 \times 10^{18}/cm^3$ to about $1 \times 10^{20}/cm^3$.

10. The diffusion resistor of claim 1, in combination with a radio frequency driver circuit having an input and an output, wherein the output is coupled to a transmission line, and wherein the diffusion resistor is coupled between the input and the output of the radio frequency driver circuit to provide a variable resistance feedback path for use in adjusting an Impedance of the radio frequency driver circuit to substantially match an impedance of the transmission line, wherein the bias voltage is a DC bias voltage.

11. A method of using the diffusion resistor of claim 1 as a resistor with no DC bias voltage applied on either of the first conductive contact and the second conductive contact.

* * * * *